United States Patent
Wang

(10) Patent No.: US 10,815,566 B2
(45) Date of Patent: Oct. 27, 2020

(54) FLEXIBLE SUBSTRATE AND MANUFACTURING METHOD THEREOF, DISPLAY

(71) Applicant: Wuhan China Star Optoelectronics Semiconductor Display Technology Co., Ltd., Wuhan (CN)

(72) Inventor: Xuanyun Wang, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/740,708

(22) PCT Filed: Nov. 23, 2017

(86) PCT No.: PCT/CN2017/112577
§ 371 (c)(1),
(2) Date: Aug. 29, 2018

(87) PCT Pub. No.: WO2019/075844
PCT Pub. Date: Apr. 25, 2019

(65) Prior Publication Data
US 2019/0119811 A1    Apr. 25, 2019

(30) Foreign Application Priority Data
Oct. 19, 2017    (CN) .......................... 2017 1 0991023

(51) Int. Cl.
*C23C 16/24*    (2006.01)
*C23C 16/40*    (2006.01)
(Continued)

(52) U.S. Cl.
CPC .............. *C23C 16/24* (2013.01); *B32B 27/00* (2013.01); *C23C 16/345* (2013.01); *C23C 16/401* (2013.01); *B05D 1/60* (2013.01)

(58) Field of Classification Search
None
See application file for complete search history.

(56) References Cited

U.S. PATENT DOCUMENTS 8,552,634 B2 * 10/2013 Kim .................... H01L 51/5256
                                                      313/504
9,070,895 B2 *  6/2015 Lin ......................... H01L 51/52
(Continued)

FOREIGN PATENT DOCUMENTS

| CN | 103730598   | * | 4/2014 |
| CN | 103730598 A |   | 4/2014 |
| CN | 105977394 A |   | 9/2016 |

*Primary Examiner* — Nathan T Leong
(74) *Attorney, Agent, or Firm* — Brinks Gilsson & Lione

(57) ABSTRACT

A flexible substrate, a manufacturing method thereof and a display are provided. The method includes: forming a first organic layer on a substrate; forming a first buffer layer on the first organic layer; forming an inorganic layer on the first buffer layer; and forming a second organic layer above the inorganic layer. In this way, it is possible to enhance the adhesion between the first organic layer and the inorganic layer due to the arrangement of the first buffer layer, and in turn reduce or even eliminate the risk that the first organic layer and the inorganic layer may be fallen off from each other during the bending process of the flexible substrate, enhance the anti-water and anti-oxygen abilities of the flexible substrate, and improve the quality of the substrate.

12 Claims, 2 Drawing Sheets

(51) Int. Cl.
 *C23C 16/34* (2006.01)
 *B32B 27/00* (2006.01)
 *B05D 1/00* (2006.01)

(56) References Cited

U.S. PATENT DOCUMENTS 9,224,981 B2 * 12/2015 Kang .................. H01L 51/5253
9,224,988 B2 * 12/2015 Lee ...................... H01L 51/003
2008/0238301 A1 10/2008 Shim et al.

* cited by examiner

FLEXIBLE SUBSTRATE AND MANUFACTURING METHOD THEREOF, DISPLAY

CROSS-REFERENCE TO RELATED APPLICATIONS

The present application is a 35 U.S.C. § 371 National Phase conversion of International (PCT) Patent Application No. PCT/CN2017/112577 filed Nov. 23, 2017, which claims foreign priority to Chinese Patent Application No. 201710991023.7, filed on Oct. 19, 2017 in the State Intellectual Property Office of China, the entire contents of which are hereby incorporated by reference.

TECHNICAL FIELD

Embodiments of the present disclosure generally relate to display technology, and in particular relate to a flexible substrate, a manufacturing method of the flexible substrate and a display.

BACKGROUND

Flexible displays become inevitable trends of the future development of displays, since the flexible displays are fashionable, thinner and lighter, flexible, foldable, portable, and each have a high contrast, a high reflection, a wide viewing angle, or the like. In a flexible display, water and oxygen are prevented from entering the flexible display by a package structure in an upper layer and a flexible substrate in a bottom layer, in order to guarantee the quality of the flexible display. The flexible substrate may be divided into a first kind of flexible substrate having a single-layer PI (polyimide) structure, and a second kind of flexible substrate having a multi-layer PI structure. The flexible substrate having the multi-layer PI structure becomes a mainstream choice at present, since the flexible substrate having the multi-layer PI structure has anti-water and anti-oxygen abilities much greater than those of the flexible substrate having the single-layer PI structure. In general, the flexible substrate having the multi-layer PI structure is formed by alternately laminating PI layers and inorganic layers.

However, due to interface differences between the PI layers and the inorganic layers, the adhesion between the PI layers and the inorganic layers is decreased. In this way, there is a risk that the PI layers and the inorganic layers may fall off from each other during the bending process of the flexible structure having the multi-layer PI structure. Thus, the anti-water and anti-oxygen abilities of the flexible substrate are decreased, and the quality of the flexible substrate is also declined.

SUMMARY

The objective of the present disclosure is to provide a flexible substrate, a manufacturing method of the flexible substrate and a display comprising the flexible substrate, aiming at the problems in the related art that the anti-water and anti-oxygen abilities of the flexible substrate are decreased since the organic layer and the inorganic layer may fall off from each other during the bending process of the flexible.

To solve the technical problems above, in one aspect, a technical solution is adopted in the present application to provide a manufacturing method of a flexible substrate comprising: forming a first organic layer on a substrate; forming a first buffer layer on the first organic layer; forming an inorganic layer on the first buffer layer; forming a second buffer layer on the inorganic layer; and forming a second organic layer on the second buffer layer; wherein forming the first buffer layer on the first organic layer comprises: depositing silicide on the first organic layer by using a chemical vapor deposition method to form the first buffer layer.

To solve the technical problems above, in another aspect, another technical solution is adopted in the present application to provide a flexible substrate comprising: a first organic layer, formed on a substrate; a first buffer layer, formed on the first organic layer; an inorganic layer, formed on the first buffer layer; and a second organic layer, arranged above the inorganic layer.

To solve the technical problems above, in another aspect, another technical solution is adopted in the present application to provide a display comprising the flexible substrate described above.

The present disclosure may have the following advantages: different from the related art, in the present disclosure, the first organic layer is formed on the substrate, the first buffer layer is formed on the first organic layer, the inorganic layer is formed on the first buffer layer, and the second organic layer is formed above the inorganic layer. In this way, it is possible to enhance the adhesion between the first organic layer and the inorganic layer due to the arrangement of the first buffer layer, and in turn reduce or even eliminate the risk that the first organic layer and the inorganic layer may be fallen off from each other during the bending process of the flexible substrate, enhance the anti-water and anti-oxygen abilities of the flexible substrate, and improve the quality of the substrate.

BRIEF DESCRIPTION OF THE DRAWINGS

In order to make the technical solution described in the embodiments of the present application more clearly, the drawings used for the description of the embodiments will be briefly described. Apparently, the drawings described below are only parts of the embodiments of the present disclosure. It should be understood that, one skilled in the art may acquire other drawings based on these drawings, without making any inventive work. In the drawings.

DETAILED DESCRIPTION

The technical solution of the embodiments of the present application will be described more clearly and completely with reference to the accompanying drawings. Apparently, the embodiments described here are only some exemplary embodiments, not all the embodiments. Based on the embodiments described in the present application, one skilled in the art may acquire all other embodiments without any creative work. All these shall be covered within the protection scope of the present application.

Figure 1:
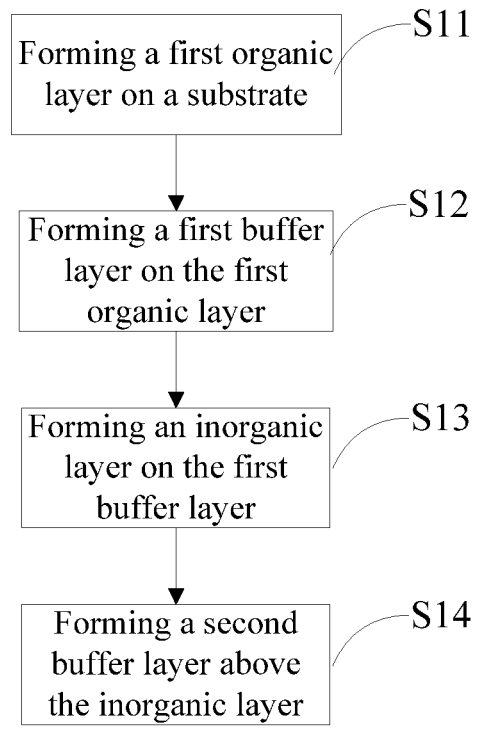
FIG. 1 is a flow chart of a manufacturing method of a flexible substrate according to a first embodiment of the present disclosure.
Figure 2:
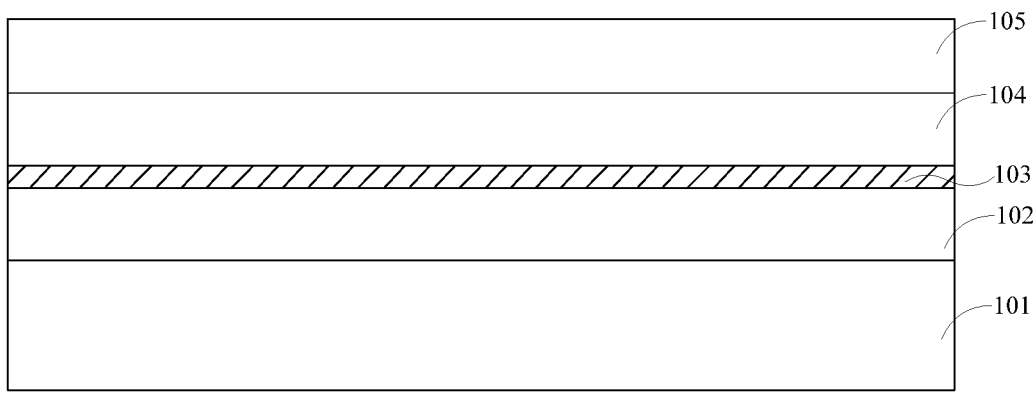
FIG. 2 is a structural schematic view of the flexible substrate according to the first embodiment of the present disclosure.

Referring to FIG. 1 and FIG. 2 together, a manufacturing method of a flexible substrate according to a first embodiment of the present disclosure may include the following blocks.

At S11, a first organic layer 102 may be formed on a substrate 101.

In specific, it is possible to form the first organic layer 102 on the substrate 101 by coating polyimide on the substrate 101 via a slot coating apparatus to form a polyimide thin film, and further performing a high-temperature curing to the polyimide thin film.

Optionally, the substrate 101 may be a glass substrate.

At S12: a first buffer layer 103 may be formed on the first organic layer 102.

In specific, the first buffer layer 103 may be formed on the first organic layer 102 by depositing silicide on the first organic layer 102 by using a chemical vapor deposition method.

Optionally, the silicide may include at least one material selected from a group consisting of a-Si, SiN and SiO. When the silicide includes one material selected from the group consisting of a-Si, SiN and SiO, the first buffer layer 103 may be namely a single-layer structure. However, when the silicide includes at least two materials selected from the group consisting of a-Si, SiN and SiO, the first buffer layer 103 may be a single-layer structure formed by a mixture of at least two silicides selected from the group consisting of a-Si, SiN and SiO. It is also possible for the first buffer layer 103 to be a multi-layer structure formed together by a plurality of single-layer structures which are individually formed by each silicide selected from the group consisting of a-Si, SiN and SiO.

Optionally, the first buffer layer 103 may have a thickness of 10~50 nm. In this embodiment, the first buffer layer 103 may have the thickness of 10 nm, 20 nm, 30 nm, 40 nm or 50 nm.

At S13: an inorganic layer 104 may be formed on the first buffer layer 103.

In specific, the inorganic layer 104 may be formed by depositing SiN and/or SiO on the first buffer layer 103 by using the chemical vapor deposition method. In this case, when one of the SiN and the SiO is deposited on the first buffer layer 103, the inorganic layer 104 may be a single-layer structure. However, when both the SiN and the SiO are deposited, the inorganic layer 104 may be a single-layer structure formed by a mixture of the SiN and SiO, or may be a dual-layer structure formed by single-layer structures respectively formed by the SiN and by the SiO.

Optionally, the inorganic layer 104 may have a thickness of 400~1200 nm. In this embodiment, the inorganic layer 104 may have the thickness of 400 nm, 500 nm, 600 nm, 700 nm, 800 nm, 900 nm, 1000 nm, 1100 nm or 1200 nm.

At S14: a second organic layer 105 may be formed above the inorganic layer 104.

In specific, it is possible to form the second organic layer 105 by coating the polyimide on the inorganic layer 104 via the slot coating apparatus to form a polyimide thin film, and further performing a high-temperature curing to the polyimide thin film.

In this embodiment, the first buffer layer 103 is formed between the first organic layer 102 and the inorganic layer 104, in order to enhance the adhesion between the first organic layer 102 and the inorganic layer 104, and in turn reduce or even eliminate the risk that the first organic layer 102 and the inorganic layer 104 may be fallen off from each other during the bending process of the flexible substrate, enhance the anti-water and anti-oxygen abilities of the flexible substrate, and improve the quality of the substrate.

Figure 3:
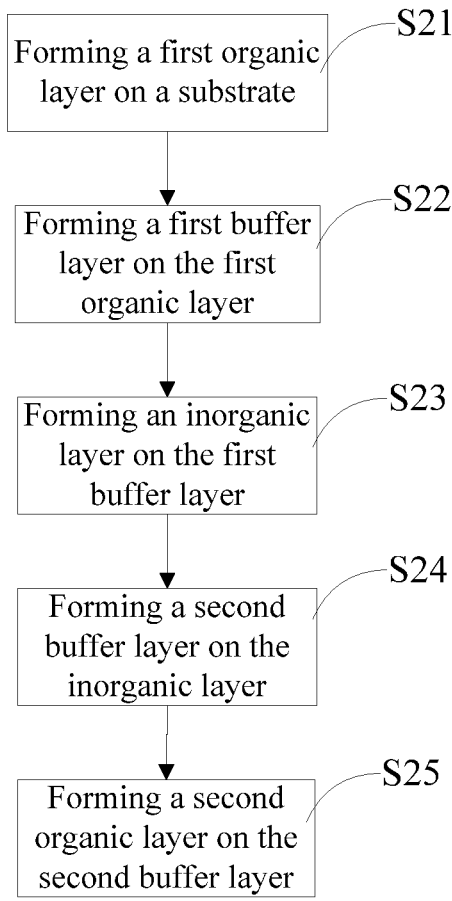
FIG. 3 is a flow chart of a manufacturing method of a flexible substrate according to a second embodiment of the present disclosure.
Figure 4:
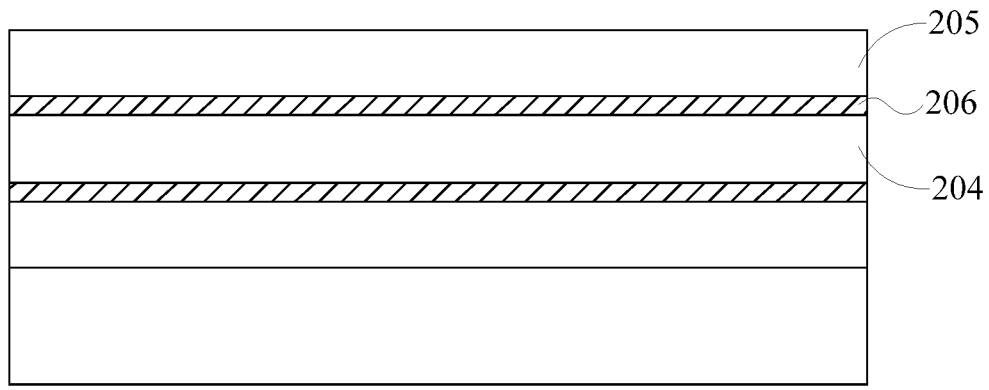
FIG. 4 is a structural schematic view of the flexible substrate according to the second embodiment of the present disclosure.

Referring to FIG. 3 and FIG. 4 together, in a manufacturing method of a flexible substrate according to a second embodiment of the present disclosure, the blocks S21~S23 are the same as the blocks S11~S13 in the first embodiment. The manufacturing method according to the second embodiment may further include the following blocks.

At S24: a second buffer layer 206 may be further formed on the inorganic layer 204.

In specific, the second buffer layer 206 may be formed on the inorganic layer 204 by depositing the silicide on the inorganic layer 204 by using the chemical vapor deposition method.

Optionally, the silicide may include at least one material selected from a group consisting of a-Si, SiN and SiO. When the silicide includes one material selected from the group consisting of a-Si, SiN and SiO, the second buffer layer 206 may be namely a single-layer structure. However, when the silicide includes at least two materials selected from the group consisting of a-Si, SiN and SiO, the second buffer layer 206 may be a single-layer structure formed by a mixture of at least two silicides selected from the group consisting of a-Si, SiN and SiO. It is also possible for the first buffer layer 103 to be a multi-layer structure formed together by a plurality of single-layer structures which are individually formed by each silicide selected from the group consisting of a-Si, SiN and SiO.

Optionally, the second buffer layer 206 may have a thickness of 10~50 nm. In this embodiment, the second buffer layer 206 may have the thickness of 10 nm, 20 nm, 30 nm, 40 nm or 50 nm.

At S25: a second inorganic layer 205 may be formed on the second buffer layer 206.

In specific, it is possible to form the second inorganic layer 205 by coating the polyimide on the second buffer layer 206 via the slot coating apparatus to form a polyimide thin film, and further performing a high-temperature curing to the polyimide thin film.

In this embodiment, the second buffer layer 206 is formed between the inorganic layer 204 and the second organic layer 205, in order to enhance the adhesion between the inorganic layer 204 and the second organic layer 205, and in turn reduce or even eliminate the risk that the inorganic layer 204 and the second organic layer 205 may be fallen off from each other during the bending process of the flexible substrate, enhance the anti-water and anti-oxygen abilities of the flexible substrate, and improve the quality of the substrate.

Referring to FIG. 2 further, the flexible substrate according to the first embodiment of the present disclosure may include the first organic layer 102 formed on the substrate 101, the first buffer layer 103 formed on the first organic layer 102, the inorganic layer 104 formed on the first buffer layer 103, and a second organic layer 105 formed above the inorganic layer 104.

Optionally, the first buffer layer 103 may be made from at least one material selected from a group consisting of a-Si, SiN and SiO. The first buffer layer 103 may have a thickness of 10~50 nm.

The individual layers of the flexible substrate of the first embodiment may be manufactured by the method descried in the first embodiment, and the manufacturing may specifically refer to the blocks of the method described in the first embodiment, and will not be described in detail any more.

Referring to FIG. 4 further, the flexible substrate according to the second embodiment of the present disclosure may further include the second buffer layer 206 formed on the inorganic layer 204.

In this embodiment, the second organic layer 205 may be formed on the second buffer layer 206. Other structures in the second embodiment are the same as those in the flexible structure in the first embodiment. The individual layers may be manufactured by the method descried in the second embodiment, and the manufacturing may specifically refer to the blocks of the method described in the second embodiment, and will not be described in detail any more.

The present disclosure may further provide a display including the flexible substrate described in any embodiment aforementioned.

Different from the related art, in the present disclosure, the first organic layer is formed on the substrate, the first buffer layer is formed on the first organic layer, the inorganic layer is formed on the first buffer layer, and the second organic layer is formed above the inorganic layer. In this way, it is possible to enhance the adhesion between the first organic layer and the inorganic layer due to the arrangement of the first buffer layer, and in turn reduce or even eliminate the risk that the first organic layer and the inorganic layer may be fallen off from each other during the bending process of the flexible substrate, enhance the anti-water and anti-oxygen abilities of the flexible substrate, and improve the quality of the substrate.

The descriptions above are merely the embodiments of the present disclosure, and are not intended to limit the protection scope of the present disclosure. In fact, one skilled in the art may make many equivalents and modifications based on the specification and the drawings of the present disclosure, or directly or indirectly apply these to other relevant technical fields. All these shall all be covered within the protection of the disclosure.

What is claimed is:

1. A manufacturing method of a flexible substrate in a bottom layer of a flexible display, comprising:
   forming a first organic layer on a substrate in the bottom layer of the flexible display;
   forming a first buffer layer on the first organic layer;
   forming an inorganic layer on the first buffer layer; and
   forming a second organic layer above the inorganic layer, wherein the flexible display further comprises a package structure in an upper layer thereof, and the flexible substrate and the package structure are respectively disposed at two opposite sides of the flexible display.

2. The method of claim 1, wherein forming the second organic layer above the inorganic layer comprises:
   forming a second buffer layer on the inorganic layer; and
   forming the second organic layer on the second buffer layer.

3. The method of claim 2, wherein forming the second buffer layer on the inorganic layer comprises:
   depositing silicide on the inorganic layer by using the chemical vapor deposition method.

4. The method of claim 2, wherein either the first buffer layer, or the second buffer layer, or both has a thickness of 10~50 nm.

5. The method of claim 2, further comprising enhancing adhesion between the second organic layer and the inorganic layer by the arrangement of the second buffer layer.

6. The method of claim 1, wherein forming the first buffer layer on the first organic layer comprises:
   depositing silicide on the first organic layer by using a chemical vapor deposition method.

7. The method of claim 6, wherein the silicide comprises one or more material selected from the group consisting of a-Si, SiN and SiO.

8. The method of claim 7, wherein when the silicide comprises at least two materials selected from the group consisting of a-Si, SiN and SiO, the first buffer layer is either a first single-layer structure formed by a mixture of the at least two materials, or a multi-layer structure formed by a plurality of second single-layer structures, wherein each of the second single-layer structures is formed by one selected material.

9. The method of claim 1, wherein the inorganic layer has a thickness of 400~1200 nm.

10. The method of claim 1, wherein forming the first organic layer on the substrate comprises:
    coating polyimide on the substrate via a slot coating apparatus to form a polyimide thin film; and
    performing a high-temperature curing to the polyimide thin film to form the first organic layer.

11. The method of claim 1, wherein the first organic layer is in direct contact with the substrate.

12. The method of claim 1, further comprising enhancing adhesion between the first organic layer and the inorganic layer by the arrangement of the first buffer layer.

* * * * *

UNITED STATES PATENT AND TRADEMARK OFFICE
CERTIFICATE OF CORRECTION

PATENT NO. : 10,815,566 B2
APPLICATION NO. : 15/740708
DATED : October 27, 2020
INVENTOR(S) : Xuanyun Wang Page 1 of 1

It is certified that error appears in the above-identified patent and that said Letters Patent is hereby corrected as shown below:

On the Title Page

In (74) Attorney, Agent, or Firm, delete "Gilsson" and insert in its place --Gilson--.

Signed and Sealed this
Fifteenth Day of December, 2020

Andrei Iancu
*Director of the United States Patent and Trademark Office*